United States Patent [19]
Campbell et al.

[11] 3,989,943
[45] Nov. 2, 1976

[54] ANGULARLY ADJUSTABLE OPTICAL SWITCH ASSEMBLY

[76] Inventors: John E. Campbell, 1320 W. Esther St., Long Beach, Calif. 90813; Douglas A. Harley, 6171 Sydney Drive, Huntington Beach, Calif. 92647; Herbert S. Lee, 3262 Tucker Lane, Los Alamitos, Calif. 90720; John E. Juhasz, 1320 W. Esther St., Long Beach, Calif. 90813

[22] Filed: July 3, 1975

[21] Appl. No.: 592,982

[52] U.S. Cl. ................... 250/233; 250/231 R; 250/237 R; 250/578; 317/127; 350/275
[51] Int. Cl.² ................................ G01D 5/34
[58] Field of Search .............. 250/233, 237 R, 229, 250/231 R, 578, 206, 208, 566, 570; 317/124, 127; 350/266, 273, 275

[56] References Cited
UNITED STATES PATENTS

| | | |
|---|---|---|
| 1,880,105 | 9/1932 | Reifel ................................ 250/233 |
| 2,420,013 | 5/1947 | Rajchman ...................... 250/233 X |
| 3,111,841 | 11/1963 | Gray ............................. 250/233 X |
| 3,195,405 | 7/1965 | Clark et al. .................... 350/273 X |
| 3,683,294 | 8/1972 | Gaa ............................... 250/233 X |

*Primary Examiner*—Eugene La Roche
*Attorney, Agent, or Firm*—William C. Babcock

[57] ABSTRACT

A selectively aligned optical switching device including two adjacent translucent discs having mask segments formed on the surfaces thereof, with the first disc including a sleeve extending from the central opening thereof which is received within the central opening of the second disc. A clamping nut threadably engages the sleeve to selectively align the masking segments of the discs relative to each other. This combination of discs is clamped in concentric alignment against a timing hub which in turn is indexed by a pin relative to a rotary shaft. The mask section of the discs is then received in an optical coupling device which provides operating signals in selected coordination with the rotation of the shaft.

7 Claims, 7 Drawing Figures

ANGULARLY ADJUSTABLE OPTICAL SWITCH ASSEMBLY

BACKGROUND OF THE INVENTION

1. Field of the Invention

The present invention relates to switching devices, and more particularly to rotary optical switching devices adapted for use in logic circuits.

2. Description of the Prior Art

The use of rotary switches in various switching sequence applications have been known in the past. Most often such switches are connected to an electrical motor, and are thus driven in rotation to provide various function or control signals of a sequencing timer within each period of revolution. Typically such sequencing timers include rotary switches ganged on a common shaft, providing a plurality of switching signals at various increments of shaft rotation, which are then available to control various devices. Such rotary switch assemblies or timers are utilized for automatic sequencing of machines and where the particular machine requires unorthodox sequencing, the person assembling the machine has to search out a particular rotary switch assembly which would fit the sequence or has to modify, with extensive labor, an existing sequencing switch. As more and more manual functions are taken over by automatic controls, the use of sequence controllers or sequencing switches has become more prevalent. With the increase in automation there is also a concurrent desire to adapt the automated functions to a unique or non-standard application, with the result that the labor involved in developing a particular sequencing switch becomes a major task in the effort of tailoring an automatic system to a particular use.

SUMMARY OF THE INVENTION

Accordingly, it is the general purpose and object of the present invention to provide a sequencing switch assembly which is particularly suited for convenient adaptation to any switching sequence and which furthermore is reliable in use and requries very little maintenance.

Other objects of the invention are to provide a rotary switch for sequencing which does not entail mechanical contact operations and is therefore reliable with extended use, and requires very little maintenance.

Further objects of the invention are to provide a selectively adjustable sequencing assembly which includes optical coupling devices to provide the sequencing signals.

Yet further objects of the invention are to provide a rotary sequencing switch assembly which is particularly suited for use with digital logic devices.

These and other objects are accomplished within the present invention by combining a plurality of optical switch assemblies mounted on a common shaft for rotation where the shaft, in turn, may be driven by an electric motor, More specifically each switch assembly comprises a timing hub mounted concentrically on the rotary shaft, each timing hub including a cylindrical sleeve having a central opening conformed to the exterior diameter of the central shaft. Formed on the exterior of said sleeve and proximate one end thereof is a threaded section engaging a first clamping nut. The other end of the sleeve terminates in a peripheral flange which, around the circumference thereof, is marked with graduations in degrees indicating a full revolution. To further aid in optical alignment a pointer is provided at the zero degree mark. Disposed concentrically on the sleeve is a first shutter assembly comprising a circular disc radially extending from one end of a second cylindrical sleeve wherein the disc is arranged to abut the opposing surface of the peripheral flange with the second sleeve mounted on the first sleeve to be compressed against the flange by the first clamping nut. In this manner, selective alignment can be made of the disc forming the first shutter assembly relative the marking on the periphery of the flange, or more specifically relative the pointer. To aid such alignment, the exterior surface of the first shutter disc includes a marking strip thereon also indicating angular displacement. The disc itself is made of a translucent material and effects the function of the shutter by way of opaque surface coating segment covering a selected surface area thereof.

Mounted concentric on the second sleeve is a second shutter disc secured in the manner similar to the first shutter assembly by a second clamping nut threadably engaging the exterior of the second sleeve. This second shutter disc is similarly provided with opaque surface coatings on the exterior thereof and in combination with the first shutter disc can be aligned to provide a translucent segment over any selected section of arc. To provide for indexing of the first sleeve relative to the shaft a transverse bore is formed in the shaft at the shutter location which in turn is aligned with a pair of opposed pin openings formed in the lateral surface of the first sleeve to allow for insertion of a locking pin therethrough. This pin is retained within the openings and the transverse bore by the interior surface of the second sleeve.

Thus an assembly sequence providing any desired switching positions includes first a manual manipulation of the first sleeve to align the opposed openings thereof with the transverse bore in the shaft at which point a pin is inserted into the common interior. The first shutter assembly, including the second sleeve, is then mounted over the exterior of the first sleeve, securing the pins within the bore and the opposed openings, the first shutter assembly being compressed against the peripheral flange by the first clamping nut. At this point various angular alignments can be made of the first shutter assembly relative to the index of the shaft providing the desired angular displacement of the opaque section thereof. Once this alignment is made the arc over which both discs are translucent can be selected by manipulation of the second shutter disc. This assembly is then insertable between an optical coupling device or more specifically between the light emitting diode and the photo transistor of the optical coupling device which then provides the requisite logic signal for control of any selected apparatus.

DESCRIPTION OF THE SPECIFIC EMBODIMENT

While the present description is made with reference to sequencing timer such is for purposes of illustration only. It is to be noted that various other implementations are possible and functions other than timing can be provided, as, for example by gearing the inventive optical switch to the output of a particular geared output of a device whereby various functions can be coupled with the cycle of the device.

Figure 1:
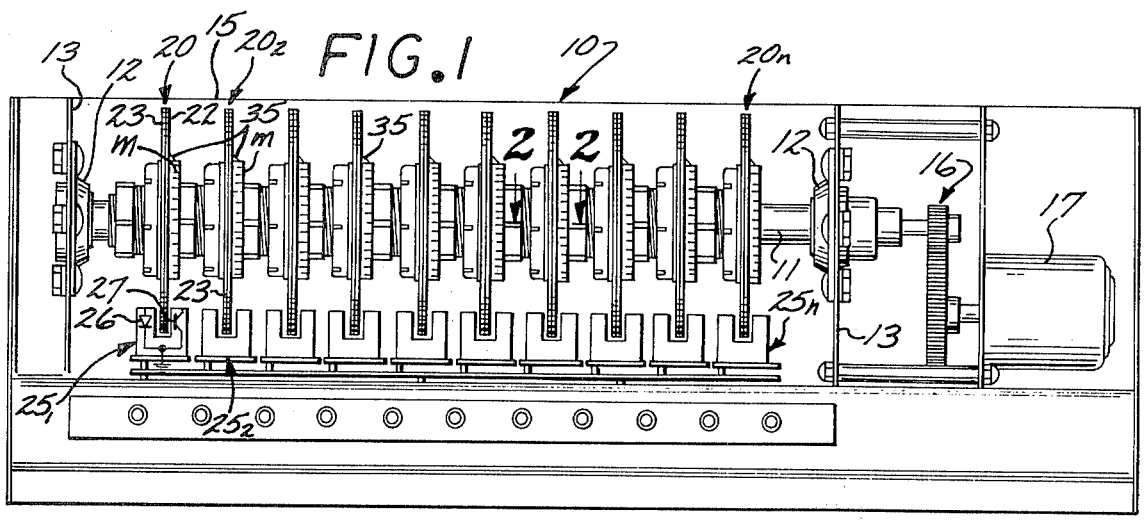
FIG. 1 is a perspective illustration of a ganged rotary switch assembly constructed according to the present invention.

As shown in FIG. 1 a timer assembly generally designated by the numeral 10 includes a central shaft 11 mounted for rotation in bearings 12 on either end thereof which in turn are retained within bearing plates 13 forming the distal walls of switch housing 15. Shaft 11 extends on one end thereof exteriorly of housing 15 to be engaged across a gear train 16 to the output of an electrical motor 17. Disposed at equal increments along the length of shaft 11 are a plurality of inventive optical shutter assemblies $20_1 - 20_N$ each comprising a first and second disc, 22 and 23 respectively, concentrically mounted on the shaft 11. Each shutter assembly $20_1 - 20_N$ is constructed in a similar manner and for that reason the shutter assembly $20_1$ is taken as the exemplary shutter assembly to be described in further detail herein. Associated with each shutter assembly is a corresponding optical coupler $25_1 - 25_N$ comprising an electrical circuit schematically including a light emitting diode 26 and a phototransducer 27 housed in a U-shape housing with the diode 26 in one leg of the U and the phototransducer 27 in the other leg of the U having received the peripheral section of the corresponding optical shutter assembly therebetween. Thus in a manner conventional to optical couplers when the light emitted by the light emitting diode 26 to the phototransducer 27 is interrupted, the phototransducer 27 will be rendered nonconductive. According to the implementation further described selective adjustment of discs 22 and 23 is provided possible to define arc segments which are commonly translucent and which by proper alignment relative the shaft 11 can therefore provide selective angular increments during which coupling occurs between the diode 26 and the transistor 27.

Figure 2:
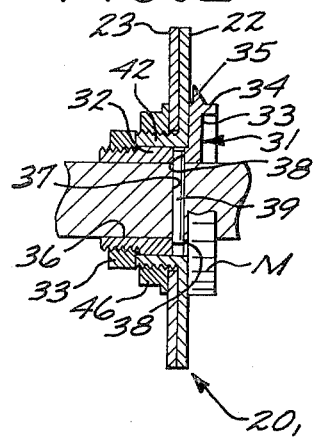
FIG. 2 is a cross sectional view of one optical switch constructed according to the present invention.

As shown in FIG. 2 the shutter assembly generally designated by the numeral $20_1$ and including the discs 22 and 23, is mounted on a timing hub designated by the numeral 31 which, in turn, comprises a tubular sleeve 32 threaded over one exterior peripheral end section thereof and terminating in a peripheral radially projecting flange 33 at the other end thereof. Formed on the peripheral edge of flange 33 is an annular lip 34 and a pointer 35. The exterior surface of the annular lip 34 is inscribed with markings M indicating the degree increments relative to the pointer which aid in the alignment of the shutter assembly $20_1$ relative to the pointer 35. Flange 33 and sleeve 32 commonly define a central opening 36 which is conformed to the exterior dimensions of shaft 11, thus allowing insertion of shaft 11 into the interior thereof. To provide for indexing of the timing hub 31 relative shaft 11 a transverse bore 37 is formed diametrically across shaft 11 which is aligned with two opposed openings 38 formed in the lateral surface of sleeve 32 to permit insertion of a pin 39 into the common interior thereof. In this manner, the timing hub 31 is secured both longitudinally and in angular alignment to shaft 11. Once so secured pin 39 is retained within the common interior by yet another sleeve 42 extending from a central opening in the disc 22 to surround in concentric alignment the exterior of sleeve 32. Again the central opening formed within sleeve 42 and disc 22 is conformed to the exterior dimensions of sleeve 32, radially aligning disc 22 relative the central axis of shaft 11.

The orientation of disc 22 and sleeve 42 is arranged to expose the free end of the sleeve 42 over the threaded exterior of sleeve 32 with the opposing surface of discs 22 abutting the interior surface of the peripheral flange 31. In this position a securing nut 33, engaging the threaded exterior of sleeve 32, is used to compress disc 22 against flange 31, thus aligning disc 22 at any selected alignment relative the pointer 35. The second shutter disc 23 is similarly secured by a second securing nut 46 threadedly engaging the exterior surface of sleeve 42. Disc 23 is thus radially aligned relative the axis of shaft 11 by the central opening thereof.

Discs 22 and 23 are of equal diameter and are thus concentrically mounted on the common shaft 11 in adjacent relationship at any selective angular alignment relative the index thereof. A positive visual indication of the angular alignment of disc 22 relative the index of shaft 11 is provided by the pointer 35, with further alignment of discs 23 being provided by selective clamping thereof against disc 22.

As shown in FIGS. 3a–3d, the corresponding surface sections of discs 22 and 23 are coated with opaque coating segments defining various angular increments of arc. For example, in FIG. 3a, disc 22 is provided with a plurality of maskings shown as segment 51 describing ninety equal segments of arc which can be combined with a single segment shown in FIG. 3b as a segment 52. Disc 22 is furthermore provided with a peripheral masking strip 53 which is dimensioned to overlie a masking strip 54 formed proximate the periphery of disc 23. Masking strips 53 and 54 when combined, provide a fringe effect mask which prevents various tolerances of manufacture and runout from allowing stray signal transmission across the optical coupling device 25. In addition, there is included on the exterior surface of disc 22 a circular strip 57 marked again with degree markings M to provide a visual indication of the angular position of disc 22 relative to the pointer.

Discs 22 and 23 are formed of a translucent material such as clear plastic and therefore will permit optical coupling between diode 26 and phototransistor 27 during instances where both overlying segments thereof are translucent. In order to control the amplitude of optical coupling disc 23 further includes a level controlling mask 56 arranged in a circular strip concentric with the central axis of the disc and therefore the central axis of shaft 11. By way of this mask arrangement a selected combination can be formed of equally spaced signal pulses designating, for example, 4 degrees of arc for each signal cycle with a longer opaque arc duration formed by aligning the segment 52 over a translucid section between segments 51. In addition, both the fringe effect associated with manufacturing tolerances and the signal levels are controlled by the fringe masks 53, 54 and 56. Thus, a signal can be developed across the optical coupling device 26 which is constantly of equal amplitude with each cycle and which furthermore can be adjusted selectively in pulse by the overlapping arrangement or segments 52 over any intersegments space between segments 51.

Figures 3A, 3B, 3C, 3D:
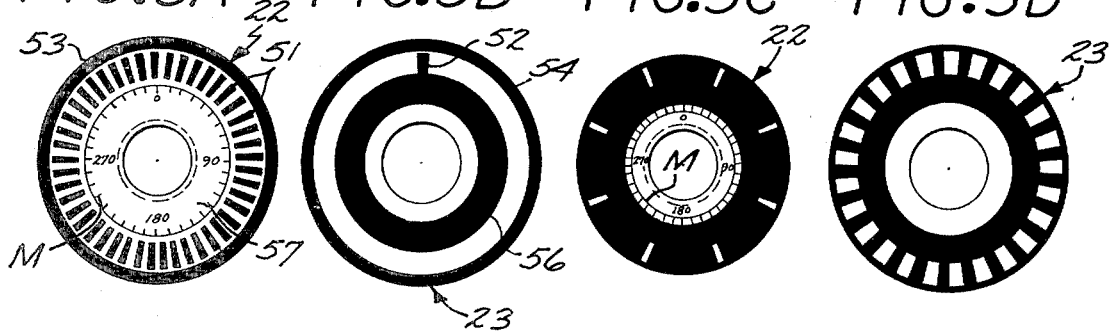
FIGS. 3a–3d illustrates in plan form various optical masks adapted for use with the present invention.

FIGS. 3c and 3d illustrate other optical masks for use with the present invention, it being understood that the selection of masks shown herein is illustrative only. It is contemplated within this invention that various other masks can be formed to provide various cycle increments relative to the rotation of shaft 11. To allow further flexibility in developing a desired mask, the user can selectively scratch off selected sections of mask, or in fact can purchase a totally clear disc and by way of masking tape develop his own mask.

All of these features lend themselves to applications which are tailored uniquely by each user. Furthermore, the user can experiment with the masks that he develops by adjusting the relative position of the discs 22 and 23 and the index of shaft 11. In this manner problems often encountered in designing an operating system can be experimentally solved as for example, where a mechanism of unknown response characteristics is coupled from known operating device.

Figure 4:
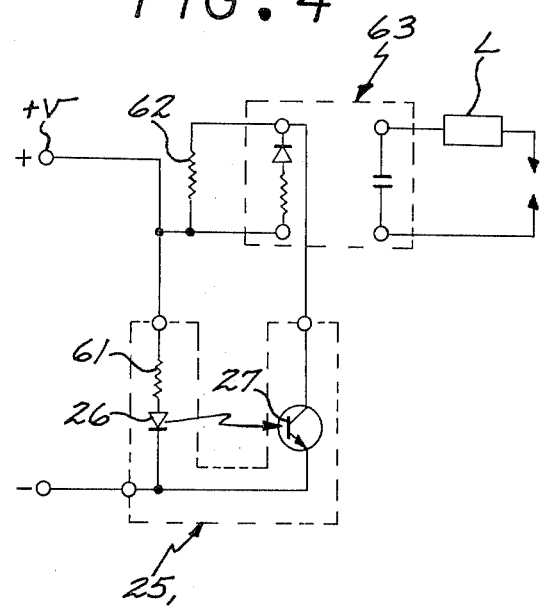
FIG. 4 is a circuit schematic of a typical optical coupling circuit useful with the present invention.

Shown in FIG. 4 is one implementation of the optical coupler 25, useful herein coupled to an AC relay interface. More specifically both the diode 26 and the phototransistor 27 are tied to a circuit common, diode 26 further receiving a DC supply signal +V across a resistor 61 in series therewith.

The same DC signal +V is connected across a collector resistor 62 to the collector of phototransistor 27, and to the input terminals, or the control terminals, of a solid state relay 63, such as a Crydon D1210 solid state relay, which in turn controls a load L. It is to be noted that this circuit arrangement is exemplary only. The use of the relay 63 in this instance is to provide an AC interface whereby an AC load can be operated in a cyclic relationship with shaft 11. Alternatively the phototransistor 27 can be used as a logic output device where the logic signal therewith can be either at the level of the supply voltage +V or can be de-coupled by way of an external pull up resistor to operate at other logic levels. Furthermore both negative and positive logic can be accommodated by the appropriate connections of a negative power supply in a manner known to those skilled in the art.

Some of the many advantages of the present invention should now be readily apparent. The invention provides by way of simple alignment, a device which is fully adjustable without complicated tools and which furthermore can accommodate various operating circuits. All these features are accomplished within the invention by a device which is easy to produce, requires almost no maintenance and is therefore reliable in use.

Obviously many modifications and variations of the apparatus disclosed herein will be apparent to those skilled in the art. It is therefore intended that the invention be limited solely by the appended claims herein.

We claim:

1. In a sequencing switch assembly comprising a central shaft mounted for rotation, means adapted to drive said shaft in rotation, a plurality of switch assemblies mounted on said shaft at selected angular alignment therewith and switching means disposed for cooperation with said switch assemblies for producing electrical signals indicative of the angular position of said shaft, the improvement comprising:

said switch assemblies each including a timing hub comprising a first sleeve conformed to receive said shaft, a peripheral flange formed on one end of said hub, securing means formed on said first sleeve for securing said hub to said shaft, a first translucent shutter disc including a second sleeve extending from the central opening thereof, said second sleeve being conformed for telescopic receipt of said first sleeve, first clamping means threadably engaging said first sleeve for compressing said second sleeve and said first disc against said peripheral flange, a second translucent shutter disc including a central opening conformed to receive said second sleeve, second clamping means threadably engaging said second sleeve for compressing said second disc against said first disc and opaque mask segments formed on the surfaces of said first and second disc; and said switching means including a photoelectric coupling circuit having disposed in the coupling path thereof said first and second shutter disc for selective interruption of the coupling path therein.

2. Apparatus according to claim 1 wherein: said shaft includes a plurality of transverse bores; and said securing means includes opposed openings formed in said first sleeve and a pin insertable into said opposed openings and said transverse bore.

3. Apparatus according to claim 2 wherein: said opposed openings are disposed for alignment within said second sleeves.

4. Apparatus according to claim 3 wherein: said first and second clamping means include a first and second nut threadably engaging respective ones of said first and second sleeves.

5. A selectively aligned shutter assembly for use with a photoelectric coupling device comprising:

a shaft mounted for rotation;

a timing hub mounted on said shaft;

a first shutter disc formed to radially extend from one end of a first central sleeve, said first central sleeve being conformed to telescopically receive said timing hub;

a second shutter disc formed for concentric mounting on said first central sleeve;

means for selectively securing said first shutter disc to said timing hub and said second shutter disc to said first sleeve;

visual indicating means formed on said timing hub and the adjacent surface of said first shutter disc for assisting said selective manual alignment thereof; and first and second clamping means for securing respectively said first central sleeve to said timing nut and said second shutter disc to said first sleeve.

6. Apparatus according to claim 5 wherein:

said first and second shutter discs include translucent segments.

7. Apparatus according to claim 6 wherein said first and second shutter discs include the circular opaque masks for controlling the radial dimensions of said translucent segments.

* * * * *